United States Patent [19]

Goto

[11] Patent Number: 4,987,601

[45] Date of Patent: Jan. 22, 1991

[54] ACOUSTIC APPARATUS

[75] Inventor: Motoomi Goto, Hamamatsu, Japan

[73] Assignee: Yamaha Corporation, Hamamatsu, Japan

[21] Appl. No.: 389,737

[22] Filed: Aug. 4, 1989

[30] Foreign Application Priority Data

Aug. 10, 1988 [JP] Japan .......................... 63-104947[U]

[51] Int. Cl.[5] ............................................. H05K 5/00

[52] U.S. Cl. ..................................... 381/159; 181/156

[58] Field of Search ............... 181/152, 153, 185, 186, 181/160, 156; 381/96, 159

[56] References Cited

U.S. PATENT DOCUMENTS

| | | | |
|---|---|---|---|
| 4,135,600 | 1/1979 | Ogi et al. | 181/156 |
| 4,213,515 | 7/1980 | Laupman | 181/156 |
| 4,276,443 | 6/1981 | Meyers | 381/96 |

*Primary Examiner*—Jin F. Ng
*Assistant Examiner*—M. Nelson McGeary, III
*Attorney, Agent, or Firm*—Spensley Horn Jubas & Lubitz

[57] ABSTRACT

An acoustic apparatus has a Helmholtz resonator having an open duct port and cavity and a vibrator disposed in the Helmholtz resonator. An opening portion of the open duct port is extended in a horn-like shape, so that the open duct port communicates with a port mounting surface with a smooth curvature. An air-flow diffusing body corresponding to the shape of the port opening portion is provided at the center of the extended port opening portion, so that an effective sectional area of the air-flow path defined by the opening portion and the diffusing body is substantially equal to a sectional area of the open duct port excluding the opening portion.

8 Claims, 4 Drawing Sheets

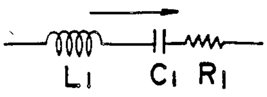
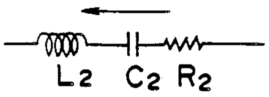
FIG. 3A FIG. 3B
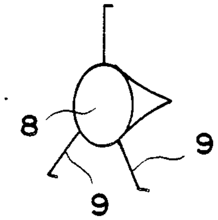
FIG. 4B
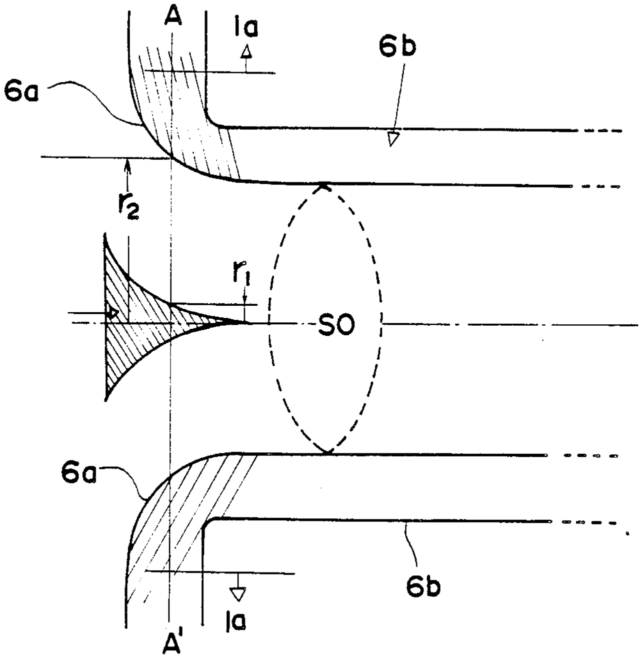
FIG. 4A

ACOUSTIC APPARATUS

BACKGROUND OF THE INVENTION

1. Field of the Invention

The present invention relates to an acoustic apparatus in which a vibrator is disposed in a Helmholtz resonator having an open duct port and a cavity.

2. Description of the Prior Art

As a conventional acoustic apparatus in which a vibrator is disposed in a Helmholtz resonator having an open duct port and a cavity, a phase-inversion (bass-reflex) speaker system is known. FIGS. 5A and 5B are respectively a perspective view and a sectional view showing an arrangement of a bass-reflex speaker system. In the speaker system shown in FIGS. 5A and 5B, a hole is formed in the front surface of a cabinet 1, and a vibrator (dynamic speaker unit) 4 constituted by a diaphragm 2 and a transducer 3 is mounted in this hole. An open duct port 6 having a sound path 5 open to an external portion is arranged below the vibrator 4. In the bass-reflex speaker system according to the conventional basic design, a resonance frequency $f_{op}$ defined by an air spring in the cabinet 1 and an air mass in the sound path 5 is set to be lower than a lowest resonance frequency $f_{oc}$ of the vibrator when it is assembled in a bass-reflex type cabinet. At a frequency higher than the resonance frequency $f_{op}$ defined by the air spring and the air mass, the phase of a sound pressure from the rear surface of the diaphragm 2 is inverted at the sound path 5, and hence, a sound directly radiated from the front surface of the diaphragm 2 is in-phase with a sound from the sound path 5, thus increasing the sound pressure. As a result, according to an optimally designed bass-reflex speaker system, the frequency characteristic of the output sound pressure can be expanded below the resonance frequency $f_{oc}$ of the vibrator. As indicated by an alternate long and two short dashed curve in FIG. 6, a uniform reproduction range can be extended as compared to that of an infinite plane baffle or a closed baffle.

FIG. 7 shows an arrangement of an acoustic apparatus (speaker system with a resonance port) shown the U.S. patent application No. 07/286,869 which was assigned to the same assignee as the present application. In the system shown in FIG. 7, the resonance frequency $f_{op}$ of a Helmholtz resonator is set to be lower than that of the bass-reflex speaker system shown in FIGS. 5A and 5B. A vibrator for driving the Helmholtz resonator is driven to cancel an air counteraction from the resonator when the resonator is driven. As a result, the acoustic apparatus can be made compact and can reproduce a lower bass sound.

However, in the speaker system with the resonance port according to the application U.S.S. No. 286,869, a distortion of a resonant acoustic wave output from the open duct port cannot always be ignored. The distortion of the resonant acoustic wave occurs more or less regardless of the type of apparatus in every acoustic apparatus in which a vibrator is disposed in a Helmholtz resonator having an open duct port and a cavity like the speaker system with the resonance port according to the application U.S.S. No. 286,869.

SUMMARY OF THE INVENTION

It is an object of the present invention to eliminate a distortion of a resonant acoustic wave in such an acoustic apparatus.

According to the present invention, in an acoustic apparatus in which a vibrator is disposed in a Helmholtz resonator having an open duct port and a cavity, an opening portion of the open duct port is extended in a horn-like shape, so that the open duct port communicates with a port mounting surface with a smooth curvature, and an air-flow diffusing body corresponding to the shape of the port opening portion is provided at the center of the extended port opening portion.

The present inventor closely examined an air communication state of an open duct port in a conventional bass-reflex speaker system or a speaker system with a resonance port according to the application U.S.S. No. 286,869, which comprises a Helmholtz resonator in which a sound path of the open duct port constituting the Helmholtz resonator is open to an external portion with a constant sectional area. As a result, the present inventor found that air inlet and outlet modes were quite different from each other.

That is,

1. In an air outlet mode, the diaphragm of the vibrator is drawn toward the interior (cabinet side) of the resonator, so that air flows out from the open duct port. In this case, the air linearly flows out from the central portion of the port.

2. In an air inlet mode, the diaphragm projects outside the resonator, so that air flows in toward the open duct port. In this case, air is gathered around the open duct port to hang about a port mounting surface (baffle), and flows in along the inner edge of the port.

3. As a result, as shown in FIGS. 3A and 3B, equivalent elements L, C, and R of a resonance system have directivity. Namely, the equivalent elements L, C, and R in the air inlet mode are different from those in the air outlet mode, thus causing a distortion in a resonant acoustic wave.

According to the present invention, an opening portion of the open duct port is extended in a horn-like shape (like a flower of a morning glory), so that the open duct port communicates with a port mounting surface with a smooth curvature, and an air-flow diffusing body corresponding to the shape of the port opening portion is provided at the center of the extended port opening portion. In this manner, the air inlet path is rendered smooth, and the shape of the flow path is improved so that an outlet air flow passes along the same path as an inlet air flow. In this manner, air outlet and inlet modes for the open duct port can be equalized. More specifically, in a conventional acoustic apparatus in which an open duct port is directly open to an external portion with a uniform sectional area, constants of a resonance system are different depending on air outlet and inlet air communication directions, as shown in FIGS. 3A and 3B. In the present invention, the shape of the opening portion of the open duct port is improved to yield $L_1 \approx L_2$, $C_1 \approx C_2$, and $R_1 \approx R_2$, thus eliminating or preventing the difference in the resonance system between the air outlet and air inlet modes.

According to the present invention, the difference in the resonance system between the air outlet and air inlet modes as a cause of the distortion of a resonant acoustic wave can be eliminated or prevented, and as a result, the distortion of the resonant acoustic wave can be eliminated.

BRIEF DESCRIPTION OF THE DRAWINGS

FIGS. 3A and 3B are equivalent circuit diagrams of a resonance system in the acoustic apparatus shown in FIG. 1;

FIG. 4A is an enlarged sectional view of an air-duct opening portion of the acoustic apparatus shown in FIG. 1;

FIG. 4B is a perspective view showing a mounting state of an air diffusing device shown in FIG. 4A;

DETAILED DESCRIPTION OF THE PREFERRED EMBODIMENT

Figure 1:
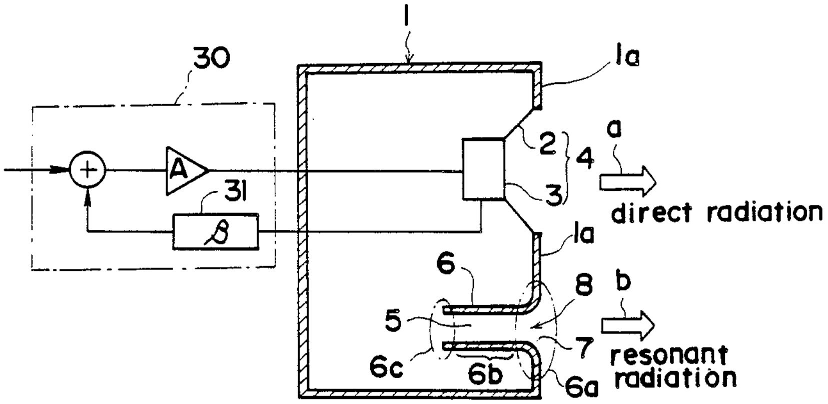
FIG. 1 is a schematic view for explaining an arrangement of an acoustic apparatus according to an embodiment of the present invention.

An embodiment of the present invention will now be described with reference to the accompanying drawings. The same reference numerals denote the common or corresponding parts throughout the drawings.

Figure 7:
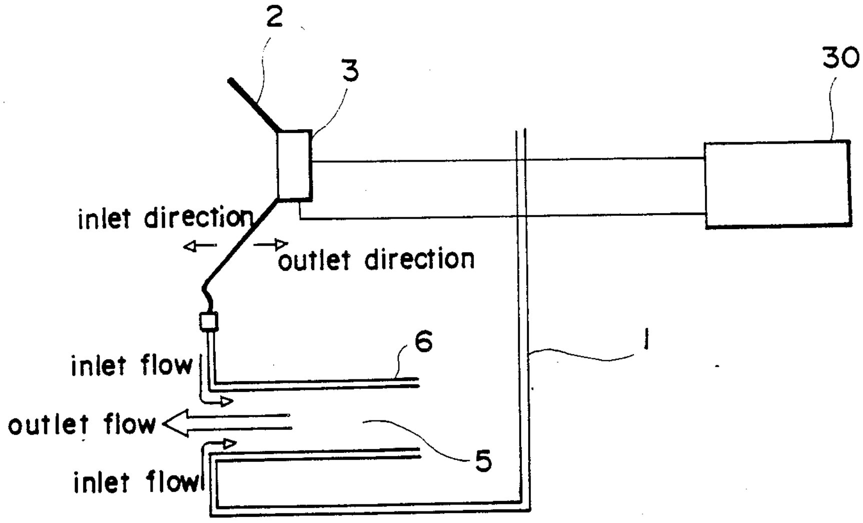
F I G. 7 (PRIOR ART)
FIG. 7 is a schematic view for explaining an arrangement of a speaker system with a resonance port according to the application U.S.S. No. 286,869.

FIG. 1 shows an arrangement of an acoustic apparatus according to an embodiment of the present invention. In the acoustic apparatus shown in FIG. 1, the shape of an air duct (open duct port) 6 of the speaker system with the resonance port shown in FIG. 7 is improved.

The common portions to the apparatus shown in FIG. 7 will be described below with reference to FIG. 1. In this acoustic apparatus, a hole is formed in the front surface of a cabinet 1, and a dynamic speaker unit (vibrator) 4 constituted by a diaphragm 2 and a transducer 3 is mounted in this hole. An air duct (open duct port) 6 having a sound path 5 open to the outside of the cabinet 1 is arranged below the speaker unit 4. The air duct 6 and the cabinet 1 form a Helmholtz resonator. In this Helmholtz resonator, an air resonance phenomenon occurs by an air spring in the cabinet 1 as a closed cavity and an air mass in the sound path 5 of the air duct 6. The resonance frequency $f_{op}$ of this resonator is given by:

$$f_{op} = \frac{c}{2\pi} \sqrt{\frac{S}{l_V}} \qquad (1)$$

where c is the sonic speed, S is the sectional area of the sound path 5, λ is the length of the air duct 6, and V is the volume of the cabinet 1.

In this acoustic apparatus, a vibrator driver 30 for driving the speaker unit 4 comprises a servo section 31 for performing electrical servo to cancel an air counteraction from the resonator side when the Helmholtz resonator constituted by the cabinet 1 and the air duct 6 is driven. Such a servo system can adopt a negative impedance generator for equivalently generating a negative impedance component ($-Z_0$) in an output impedance, a motional feedback (MFB) circuit for detecting a motional signal corresponding to a movement of the diaphragm 2 by a certain means and feeding back the detected signal to an input side, or the like.

In the acoustic apparatus with the above arrangement, when a drive signal is supplied from the vibrator driver 30 to the transducer 3 of the speaker unit 4, the transducer 3 electro-mechanically converts the drive signal to reciprocate the diaphragm 2 in the back-and-forth direction (right-and-left direction in FIG. 1). The diaphragm 2 mechano-acoustically converts this reciprocal motion. The front surface side (right surface side in FIG. 1) of the diaphragm 2 serves as a direct radiation portion for directly externally radiating an acoustic wave, and the rear surface side (left surface side in FIG. 1) of the diaphragm 2 serves as a resonator driving portion for driving the Helmholtz resonator constituted by the cabinet 1 and the air duct 6. An air counteraction from air in the cabinet 1 is applied to the rear surface side of the diaphragm 2. In this case, the vibrator driver 30 drives the speaker unit 4 to cancel this air counteraction.

When the speaker unit 4 is driven to cancel the air counteraction from the resonator upon driving of the Helmholtz resonator, the diaphragm 2 cannot be driven from the resonator side, and serves as a rigid body, i.e., a wall viewed from the resonator side. The resonance frequency and Q value of the Helmholtz resonator are independent from those of the direct radiation portion defined by the diaphragm 2 of the speaker unit 4. A resonator driving energy from the speaker unit 4 is applied independently of the direct radiation portion. Since the speaker unit 4 is driven in a so-called "dead" state wherein it is not influenced by the air counteraction from the resonator, i.e., the cabinet 1 side, the frequency characteristic of the direct radiation portion is not influenced by the volume of the cabinet 1. Therefore, with this arrangement, the volume of the cabinet 1 as the cavity of the Helmholtz resonator can be reduced to be smaller than that of the conventional bass-reflex speaker system. In this case, if the resonance frequency $f_{op}$ is set to be lower than that of this bass-reflex speaker system, a sufficient Q value can be assured. As a result, in the acoustic apparatus of this embodiment, when the cabinet 1 is reduced in size to be smaller than that of the conventional bass-reflex speaker system, a lower bass sound can be reproduced.

Figure 2:
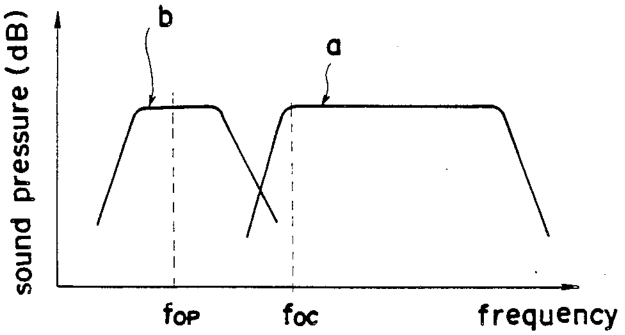
FIG. 2 is a graph showing a frequency characteristic of a sound pressure of an acoustic wave radiated from the acoustic apparatus shown in FIG. 1.

In FIG. 1, the speaker unit 4 drives the diaphragm 2 in response to the drive signal from the vibrator driver 30, and independently supplies a drive energy to the Helmholtz resonator constituted by the cabinet 1 and the air duct 6. Thus, an acoustic wave is directly radiated from the direct radiation portion (diaphragm 2), as indicated by an arrow a in FIG. 1, and air in the cabinet 1 is resonated, so that an acoustic wave at a sufficient sound pressure is resonantly radiated from a resonant radiation portion (the opening 7 of the air duct 6). A frequency characteristic of the sound pressure as shown in, e.g., FIG. 2 can be obtained under the condition that the resonance frequency $f_{op}$ is set to be lower than a reproduction frequency band $f_o$ of the speaker unit 4 by adjusting the air equivalent mass in the air duct 6 in the Helmholtz resonator, and a sound pressure at an appropriate level can be obtained from the opening 7 by setting the Q value to be an appropriate level upon adjustment of the equivalent resistance of the air duct 6. In FIG. 2, a curve a represents a frequency characteristic of a sound pressure of an acoustic wave directly radiated from the diaphragm 2, and a curve b represents a frequency characteristic of a sound pressure of an acoustic wave resonantly radiated from the opening 7.

In the acoustic apparatus, since the volume of the cabinet 1 is small, the air duct 6 is elongated as compared to the conventional bass-reflex speaker system. Since the diaphragm 2 of the speaker unit 4 is strongly driven to cancel an air counteraction from the resonator side, the flow rate of an air flow communicating through the air duct 6 is very high. In addition, when the air duct 6 is open to an external portion while it has a uniform sectional area, as shown in FIG. 7, the air flows such that the air flows out from the central portion of the air duct 6 and flows in from the inner edge portion of the air duct 6. More specifically, the effective sectional areas for the air flow are different in the outlet and inlet modes, and equivalent elements L, C, and R of the resonance system have different values in the outlet (FIG. 3A) and inlet (FIG. 3B) modes, as shown in the equivalent circuits of FIGS. 3A and 3B. As a result, a resonant acoustic wave is distorted.

Figure 5A:
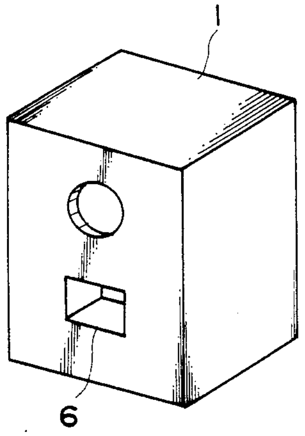
FIG. 5A (PRIOR ART)
FIGS. 5A and 5B are respectively a perspective view and a sectional view showing an arrangement of a conventional bass-reflex speaker system.
Figure 5B:
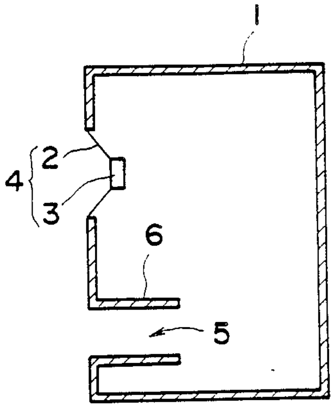
FIG. 5B (PRIOR ART)
Figure 6:
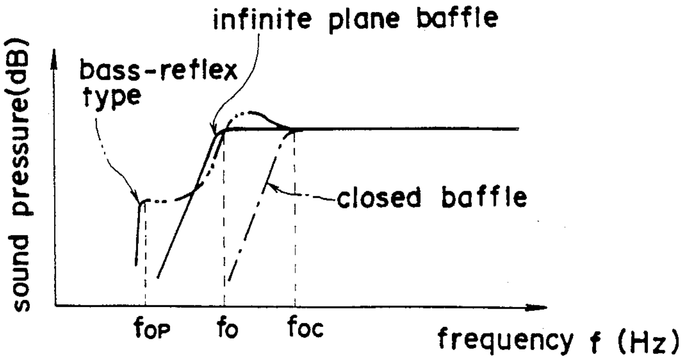
FIG. 6 (PRIOR ART)
FIG. 6 is a graph for explaining a sound pressure characteristic of the speaker system shown in FIG. 7.

Such a drawback is posed when the vibrator (speaker unit) of the conventional bass-reflex speaker system as shown in FIG. 5 is constant-voltage driven by a conventional power amplifier whose output impedance is essentially zero. However, the drawback is especially conspicuous when the speaker unit 4 is driven to cancel an air counteraction from the Helmholtz resonator to increase the Q value of the Helmholtz resonator and to increase the sound pressure of the resonant radiation like in the speaker with the resonator, as shown in FIG. 7.

Thus, in the acoustic apparatus shown in FIG. 1, the shape of an opening portion *6a* of the air duct 6 is improved to equalize air flow outlet and inlet paths.

In the apparatus shown in FIG. 1, as shown in the enlarged view of FIG. 4A, the cylindrical air duct (open duct port) 6 having a sectional area $S_o$ is extended at its opening portion (port opening portion) *6a* in a horn-like shape (like a flower of a morning glory) to communicate with an air duct mounting surface (baffle surface) *1a* of the cabinet 1 with a smooth curvature. An air diffusing device 8 having a shape according to the curvature of the air duct opening portion *6a* is supported by a support member 9 at the center of the opening 7, as shown in FIG. 4B. Thus, the effective area of the extended opening portion of the air duct 6 is set to be equal to the sectional area $S_o$ of a portion *6b* of the air duct 6 other than the opening portion. More specifically, for an arbitrary section (e.g., an A-A' section in FIG. 1) perpendicular to the central axis of the air duct 6 at the air duct opening portion *6a*, if the radius of the opening portion *6a* is represented by $r_2$, the sectional area is represented by $S_2$ ($S_2=\pi r_2^2$), the radius of the air diffusing device 8 is represented by $r_1$, and an air blocking area is represented by $S_1$ ($S_1=\pi r_1^2$), $S_2-S_1\approx S_o$ is set.

Note that the curvature formation of the horn-like shape of the air duct opening portion *6a* can be relatively easily realized using, e.g., a resin molded cabinet.

In this manner, the shape of the air duct 6 of the speaker system with the resonance port is improved such that the opening portion *6a* extending from the opening side edge portion of the uniform shape portion *6b* of the air duct 6 to the baffle mounting portion has a smooth curvature, and the air diffusing device 8 is attached at the central portion of the opening 7 of the air duct 6 so that the effective area $S_2-S_1$ of the air flow path defined by the air duct opening portion *6a* and the air diffusing device 8 is equalized to the air duct area $S_o$. Thus, the outlet air flow from the center of the air duct is guided along the diffusing device 8 having a smooth curvature, and passes the same path as the inlet air flow. The effective sectional areas for the outlet and inlet air flows of the duct 6 are equalized, thus eliminating a distortion of a resonant acoustic wave.

Application Range of the Invention

In the above embodiment, the present invention is applied to the speaker system with the resonance port shown in FIG. 7. However, the present invention is applicable to various other acoustic apparatuses such as a conventional bass-reflex speaker system, in which a vibrator is disposed in a Helmholtz resonator having an open duct port and a cavity.

In the above embodiment, the present invention is applied to the opening portion *6a* of the open duct port to the outside of the cabinet. However, the present invention may be applied to an opening portion *6c* (FIG. 1) to the interior of the cabinet or to both the opening portions *6a* and *6c*.

What is claimed is:

1. An acoustic apparatus comprising:

a Helmholtz resonator having an open duct port and a cavity, an opening portion of the open duct port being extended in a horn-like shape to communicate with, with a smooth curvature, a surface on which the port is mounted, a vibrator disposed in said Helmholtz resonator and an air flow diffusing body which has a shape according to the shape of said port opening portion so as to have a cross-sectional size which gradually increases in a direction out of the duct port to provide an outer surface of the body with a smooth curvature, the body being arranged at the center of the extended port opening portion.

2. An apparatus according to claim 1, wherein an effective sectional area of an air flow path defined by said opening portion and said diffusing body is substantially the same as the sectional area of the portion of said open duct port other than said opening portion.

3. An apparatus according to claim 1, further comprising an electrical servo means for driving said vibrator to cancel air counteraction from said resonator when said resonator is driven.

4. An apparatus according to claim 1, wherein said extended port opening portion is formed in said port mounting surface side, and said diffusing body is arranged thereon.

5. An apparatus according to claim 1, wherein said diffusing body is supported by a support member one end of which is connected to the diffusing body and another end of which is connected to said Helmholtz resonator side.

6. An apparatus according to claim 3, wherein said electrical servo means comprises a negative impedance generating means for equivalently generating a negative impedance in the output impedance thereof.

7. An apparatus according to claim 4, wherein at least the curvature formation of said horn-like shape of the opening portion is realized by using a resin molded cabinet.

8. An apparatus according to claim 1, which is a bass-reflex type speaker system.

* * * * *